(12) United States Patent
Kodera et al.

(10) Patent No.: US 6,992,009 B2
(45) Date of Patent: Jan. 31, 2006

(54) METHOD OF MANUFACTURING A SEMICONDUCTOR DEVICE

(75) Inventors: Masako Kodera, Yokohama (JP); Yoshitaka Matsui, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/237,786

(22) Filed: Sep. 10, 2002

(65) Prior Publication Data

US 2003/0068888 A1    Apr. 10, 2003

(30) Foreign Application Priority Data

Sep. 11, 2001    (JP) .............................. 2001-275593

(51) Int. Cl.
*H01L 21/44*    (2006.01)
(52) U.S. Cl. ..................................... 438/691
(58) Field of Classification Search ................. 438/691
See application file for complete search history.

(56) References Cited

U.S. PATENT DOCUMENTS 5,635,053 A  *  6/1997  Aoki et al. ................. 205/746
6,200,899 B1    3/2001  Fournier
6,569,349 B1 *  5/2003  Wang et al. ............... 252/79.1

FOREIGN PATENT DOCUMENTS

| JP | 2000-294524 | 10/2000 |
|---|---|---|
| JP | 2000-340531 | 12/2000 |
| JP | 2000-144092 | 5/2001 |
| JP | 2003-51481 | 2/2003 |
| KR | 2003-0014123 | 2/2003 |
| WO | WO 200044034 A1 * | 7/2000 |

OTHER PUBLICATIONS

Stanley Wolf Silicon Processing for the VSLI era vol. 2 Lattice Press pp. 280-282,460,494,535.*
Korean Office Action mailed Aug. 20, 2004 regarding prior art above and English translation.

* cited by examiner

*Primary Examiner*—David S. Blum
(74) *Attorney, Agent, or Firm*—Finnegan, Henderson, Farabow, Garrett & Dunner, L.L.P.

(57) ABSTRACT

Provided is a method of manufacturing a semiconductor device, comprising preparing a base comprising a semiconductor substrate having a device surface side, a p-type semiconductor layer formed on the device surface side of the semiconductor substrate, a n-type semiconductor layer which is formed on the device surface side of the semiconductor substrate and forms a p-n junction together with the p-type semiconductor layer, and wirings formed above the semiconductor substrate and electrically connected to each other via the p-n junction, applying a chemical solution containing electrolytes to a device surface of the base, the wirings being exposed at the device surface of the base, and applying a liquid selected from the group consisting of anode water, oxidizing gas-dissolved water, radical-containing water, cathode water, reducing gas-dissolved water and an organic substance-adding solution to the device surface of the base.

14 Claims, 6 Drawing Sheets

METHOD OF MANUFACTURING A SEMICONDUCTOR DEVICE

CROSS-REFERENCE TO RELATED APPLICATIONS

This application is based upon and claims the benefit of priority from the prior Japanese Patent Application No. 2001-275593, filed Sep. 11, 2001, the entire contents of which are incorporated herein by reference.

BACKGROUND OF THE INVENTION

1. Field of the Invention

The present invention relates to a method of manufacturing a semiconductor device in which a chemical solution treatment is performed for a base on which conductors electrically connected to each other via a p-n junction are exposed.

2. Description of the Related Art

Figure 8A:
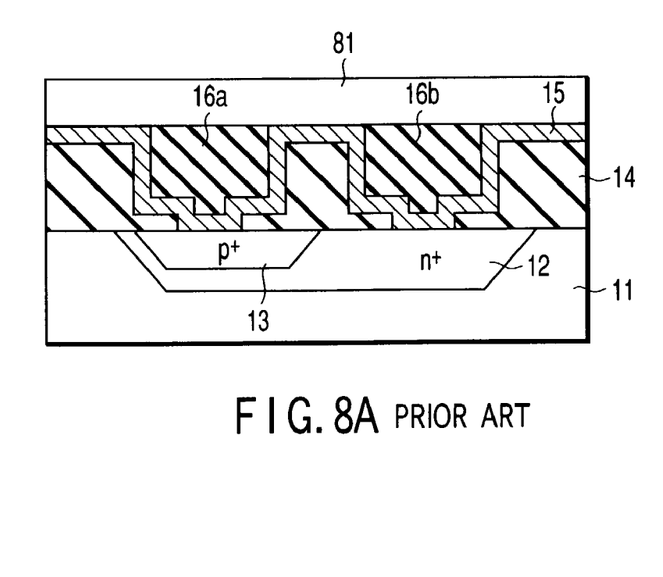
FIGS. 8A and 8B are process sectional views showing a damascene process in the manufacturing process of a semiconductor device.
Figure 8B:
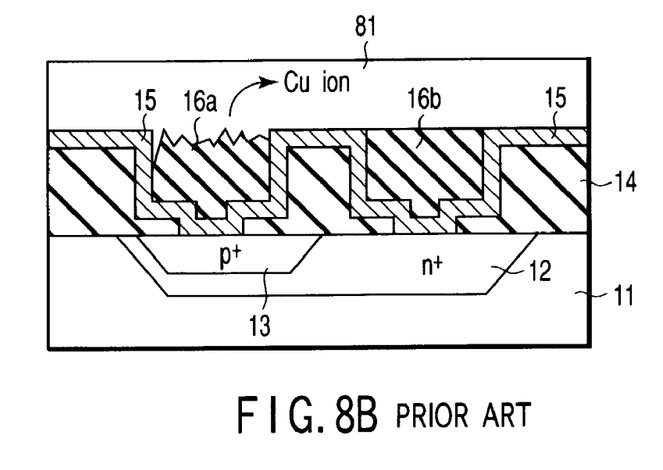

Holes and electrons are produced when light irradiates the p-n junction of a semiconductor device. This production of the holes and electrons during the device manufacturing currently poses a problem. The problem caused by irradiation of light on the p-n junction during the manufacturing of a semiconductor device will be described with reference to FIGS. 8A and 8B. FIGS. 8A and 8B are process sectional views showing a damascene process in the manufacturing process of the semiconductor device.

Referring to FIG. 8A, reference numeral 11 denotes an Si substrate; 12, $n^+$-type well; 13, $p^+$-type well; 14, insulating film; 15, barrier metal; 16a and 16b, metal wirings; and 81, slurry. The wiring 16a is connected to the $p^+$-type well 13. The wiring 16b is connected to the $n^+$-type well 12. The wirings 16a and 16b are exposed on the upper surface and patterned to be spaced apart from each other, and the barrier metal 15 is left on the device surface in the state shown in FIG. 8A. In this state, the $p^+$-type well 13 and $n^+$-type well 12 are electrically connected via the barrier metal 15. Even when light irradiates the device, the produced holes and electrons are consumed in the device.

When CMP progresses, the barrier metal 15 is removed from the device surface as shown in FIG. 8B. When light irradiates the device surface in the state shown in FIG. 8B, positive ions are segregated on the surface of the wiring 16b connected to the $n^+$-type well 12. On the other hand, the metal dissolves on the surface of the wiring 16a connected to the $p^+$-type well 13. This results in a so-called light corrosion to deform and transelement the metal. Thus, sometimes the subsequent process cannot be performed, and the device characteristic itself is damaged.

The CMP is exemplified in this description. However, the dissolution/ion segregation reaction may occur with the same mechanism as in the above description in a solution treatment process for a device having the same structure as in FIG. 8B. For example, this problem is posed in a chemical solution treatment process after via holes are formed.

BRIEF SUMMARY OF THE INVENTION

According to an aspect of the present invention, there is provided a method of manufacturing a semiconductor device comprising:

preparing a base comprising a semiconductor substrate having a device surface side, a p-type semiconductor layer formed on the device surface side of the semiconductor substrate, a n-type semiconductor layer which is formed on the device surface side of the semiconductor substrate and forms a p-n junction together with the p-type semiconductor layer, an insulating film which is formed above the semiconductor substrate, p-type semiconductor layer, and n-type semiconductor layer and has a plurality of openings, and a conductor formed in the openings and on the insulating film and electrically connected to the p-type semiconductor layer and n-type semiconductor layer;

removing the conductor on the insulating film by performing chemical mechanical polishing by relatively moving the base and a polishing pad while supplying a slurry between the polishing pad and the base, in a state in which a surface of the polishing pad is contacted with the conductor which is placed face down, to form wirings in each of the plurality of openings;

applying a liquid between the polishing pad and the base, without releasing the base from the polishing pad after forming the wirings, the liquid is at least one selected from the group consisting of anode water obtained by electrolyzing pure water or ultra pure water, a first solution prepared by dissolving oxidizing gas in pure water or ultra pure water, a second solution prepared by introducing radical atoms and/or molecules into pure water or ultra pure water, cathode water obtained by electrolyzing pure water or ultra pure water and a third solution prepared by dissolving reducing gas in pure water or ultra pure water; and releasing the base from the polishing pad.

According to an another aspect of the present invention, there is provided a method of manufacturing a semiconductor device, comprising:

preparing a base comprising a semiconductor substrate having a device surface side, a p-type semiconductor layer formed on the device surface side of the semiconductor substrate, a n-type semiconductor layer which is formed on the device surface side of the semiconductor substrate and forms a p-n junction together with the p-type semiconductor layer, a first insulating film which is formed above the semiconductor substrate, p-type semiconductor layer and n-type semiconductor layer and has a plurality of first openings, a plurality of conductors formed in the first openings and electrically connected to each other via the p-n junction, and a second insulating film formed on the first insulating film and the conductors;

forming a plurality of second openings in the second insulating film, the conductors being exposed in a bottom surface of the second openings respectively;

applying a chemical solution containing electrolytes to a device surface of the base in which the second openings are formed; and applying a liquid to the device surface of the base during or after the applying the chemical solution, or both during and after the applying the chemical solution, the liquid being at least one selected from the group consisting of anode water obtained by electrolyzing pure water or the ultra pure water, a first solution prepared by dissolving oxidizing gas in pure water or the ultra pure water, a second solution prepared by introducing radical atoms and/or molecules into pure water or the ultra pure water, cathode water obtained by electrolyzing pure water or the ultra pure water and a third solution prepared by dissolving reducing gas in pure water or the ultra pure water.

According to an a still another aspect of the present invention, there is provided a method of manufacturing a semiconductor device, comprising:

preparing a base comprising a semiconductor substrate having a device surface side, a p-type semiconductor layer formed on the device surface side of the semiconductor substrate, a n-type semiconductor layer which is formed on the device surface side of the semiconductor substrate and forms a p-n junction together with the p-type semiconductor layer, and wirings formed above the semiconductor substrate and electrically connected to each other via the p-n junction;

applying a chemical solution containing electrolytes to a device surface of the base, the wirings being exposed at the device surface of the base; and applying an organic substance-adding solution to the device surface of the base during or after the applying the chemical solution, or both during and after the applying the chemical solution, the organic substance-adding solution including at least one substance selected from the group consisting of benzotriazole, binziimdazole, N—N ammonium sodium diethyldithiocarbamate, cupferron and picolinic acid.

DETAILED DESCRIPTION OF THE INVENTION

Embodiments of the present invention will be described below with reference to the accompanying drawings.

(First Embodiment)

Figure 1A:
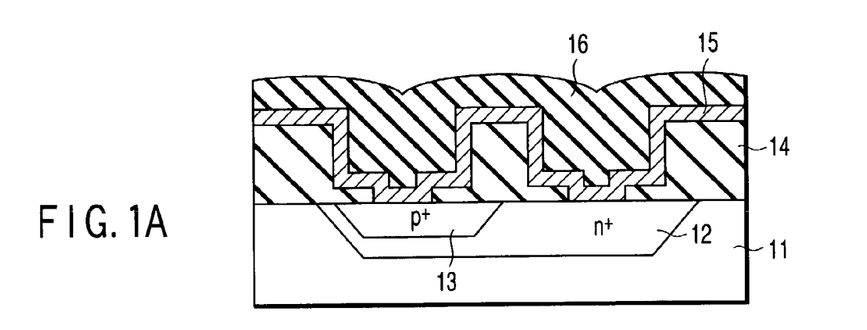
FIGS. 1A and 1B are process sectional views showing the manufacturing process of a semiconductor device according to the first embodiment.
Figure 1B:
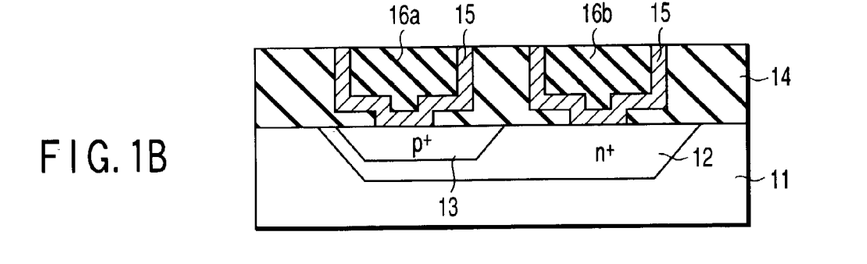

In the first embodiment, a process for forming damascene wirings as shown in FIG. 1B by performing CMP for a semiconductor device having the structure shown in FIG. 1A will be described. FIGS. 1A and 1B are process sectional views showing the manufacturing process of the semiconductor device according to the first embodiment of the present invention.

The structure of the semiconductor device shown in FIG. 1A will be described first. As shown in FIG. 1A, an n$^+$-type well 12 is formed on the upper surface of a Si substrate 11. A p$^+$-type well 13 which forms a p-n junction together with the n$^+$-type well 12 is formed on the upper surface of the Si substrate 11. An insulating film 14 is formed on the n$^+$-type well 12 and p$^+$-type well 13. Grooves in which the n$^+$-type well 12 and p$^+$-type well 13 are respectively exposed are formed in the insulating film 14. A barrier metal 15 is formed on the upper surfaces of the insulating film 14, n$^+$-type well 12, and p$^+$-type well 13. Copper (conductor) 16 is formed on the barrier metal 15 as a film forming on the entire surface of the device.

Figure 2:
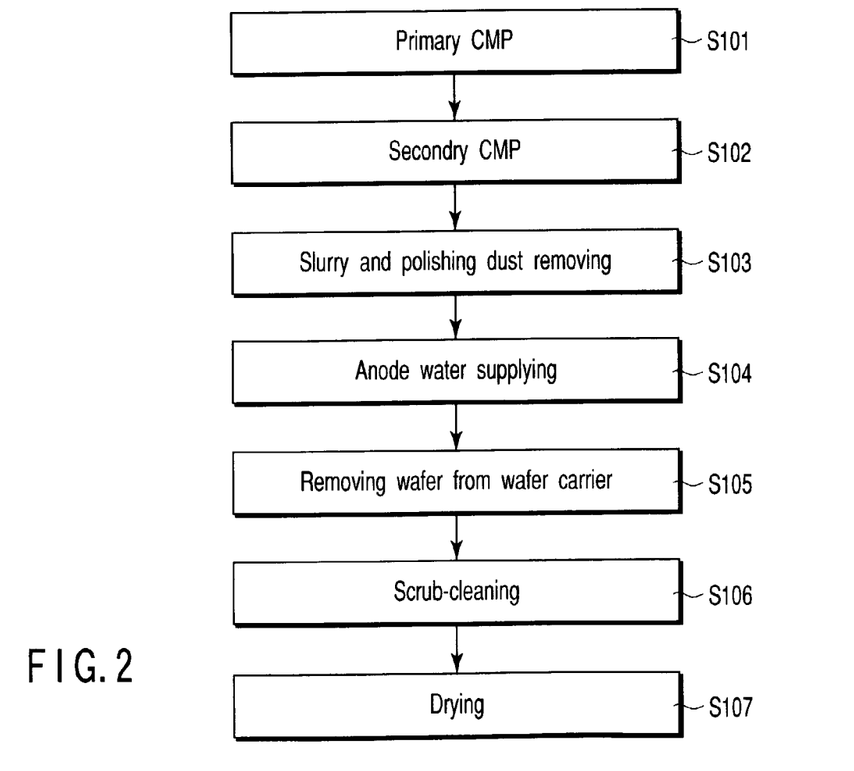
FIG. 2 is a flow chart for explaining the manufacturing process of the semiconductor device according to the first embodiment.
Figure 3A:
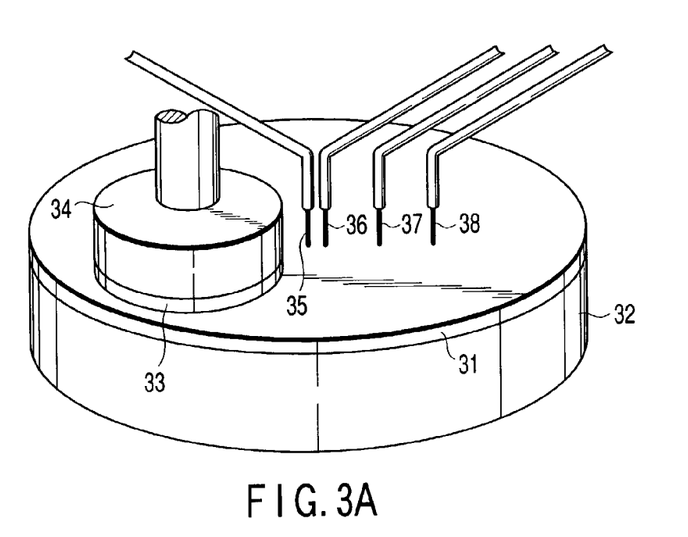
FIGS. 3A to 3C are schematic views each showing a part of the manufacturing process of the semiconductor device according to the first embodiment.
Figure 3B:
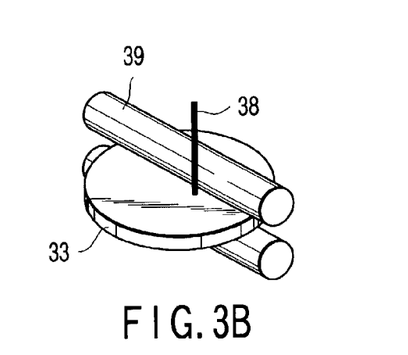
Figure 3C:
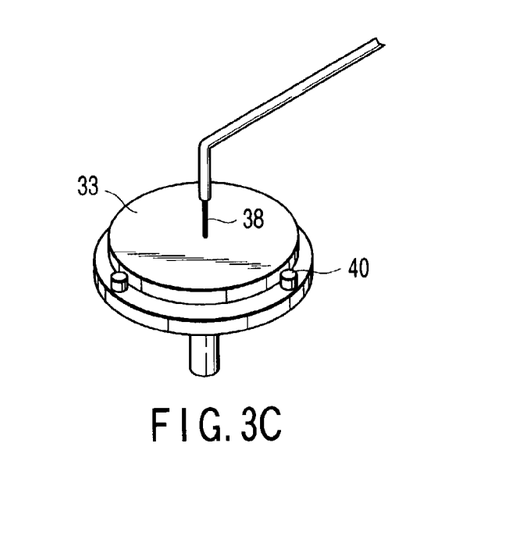

The manufacturing process of the semiconductor device according to the first embodiment will be described with reference to FIGS. 2 and 3A to 3C. FIG. 2 is a flow chart for explaining the manufacturing process of the semiconductor device according to the first embodiment of the present invention. FIGS. 3A to 3C are schematic views each showing a part of the manufacturing process of the semiconductor device according to the first embodiment of the present invention.

(Step S101: Primary CMP)

As shown in FIG. 3A, a wafer 33 of the semiconductor device shown in FIG. 1A during the device manufacture is prepared. A wafer carrier 34 of a CMP apparatus holds the wafer 33 with its device surface (the surface on which the copper 16 is formed) facing down. The device surface of the wafer 33 is pressed against a polishing pad 31 pasted on the upper surface of a turntable 32. The turntable 32 and wafer carrier 34 are respectively rotated about their own axes while supplying a slurry 35 from a nozzle onto the polishing pad 31, thereby performing CMP for the copper 16. When the barrier metal 15 on the insulating film 14 is exposed, supply of the slurry 35 is stopped.

(Step S102: Secondary CMP)

CMP for the barrier metal 15 is then performed while pressing the wafer 33 against the polishing pad 31. In this chemical mechanical polishing, the turntable 32 and wafer carrier 34 are respectively rotated about their own axes while supplying slurry 35 different from that in the primary CMP process (step S101). When the barrier metal 15 is removed and the insulating film 14 is exposed, supply of the slurry 35 is stopped. Step S102 may not be performed if the barrier metal is made of a titanium compound or a tungsten compound. This is because the barrier metal, if made of such a metal compound, can be removed by the primary CMP; the secondary CMP need not be carried out to remove the barrier metal.

At this time, since the barrier metal 15 is removed, an wiring 16a connected to the p$^+$-type well 13 and an wiring 16b connected to the n$^+$-type well 12 are not electrically connected to each other on the device surface, as shown in FIG. 1B. When the wafer is released from the polishing pad 31 after the secondary CMP, it is important to prevent light corrosion.

(Step S103: Slurry and Polishing Dust Removing)

The slurry and a polishing dust attached on the device surface of the wafer 33 is removed. In this case, the turntable 32 and wafer carrier 34 are respectively rotated about their own axes while pressing the device surface against the polishing pad 31 and supplying a chemical solution 36 and pure water 37 onto the polishing pad 31.

(Step S104: Anode Water Supplying)

The device surface of the wafer 33 is cleaned to remove the chemical solution 36 used in step S103. In this case, the turntable 32 and wafer carrier 34 are respectively rotated about their own axes while pressing the device surface against the polishing pad 31 and supplying anode water 38 which is obtained by electrolyzing pure water onto the polishing pad 31. The anode water used in this embodiment is a solution obtained by electrolyzing ultra pure water. This ultra pure water preferably has a resistivity of 18 MΩ/cm$^2$ or more and a concentration of each metal impurity of 100 ppt or less. When the anode water obtained by electrolyzing pure water is to be supplied to the copper 16, the copper easily corrodes. When Al or W is to be used as a conductor, pure water may be used. The "anode water" is obtained at the anode when water is electrolyzed. In the present embodiment the anode water containing no electrolytes. Since the device surface of the wafer 33 has been pressed against the polishing pad 31 in steps S103 and 104, the p-n junction is not irradiated with light. Consequently, light corrosion does not occur.

(Step S105: Removing Wafer from Wafer Carrier)

After the cleaning is completed, the wafer 33 is released from the polishing pad. The wafer 33 is removed from the wafer carrier 34, and the device surface of the wafer 33 is set to face up. At this time, the p-n junction may be irradiated with light, and there is the highest possibility that light corrosion occurs. In this embodiment, since anode water 38 is used in the cleaning, it remains attached on the device surface of the wafer 33. This can prevent light corrosion occurrence. An effect obtained by preventing light corrosion occurrence by anode water 38 is to be described later.

(Step S106: Scrub-cleaning)

As shown in FIG. 3B, the wafer 33 is scrub-cleaned by a roll brush 39 which can clean the both sides of the wafer 33. When scrub-cleaning the wafer 33, the roll brush 39 rotates, and the wafer 33 is similarly rotated by a rotating mechanism (not shown). As a cleaning solution, pure water or a cleaning chemical solution obtained by diluting it with pure water is generally used, but the present invention uses anode water 38 instead of pure water. Note that anode water 38 and pure water may be adopted together. In this case, using the anode water in a longer time at a higher concentration results in a higher light corrosion suppression effect.

The wafer 33 and roll brush 39 are placed horizontally, but may be placed vertically. In addition, the cleaning is not one step, but may have the two steps or more. Further, the shape of the brush is not limited to a roll shape. Noncontact cleaning such as megasonic cleaning may be used as the cleaning. This can also be prevent light corrosion if anode water 38 is used as the cleaning chemical solution.

(Step S107: Drying)

Finally, the wafer 33 is dried. As shown in FIG. 3C, the wafer 33 is rotated at a high speed while holding it by a wafer chuck 40, thereby drying it. Before the drying, rinsing of the wafer 33 may be performed. In this case, it is effective to prevent light corrosion to use the anode water 38 for the rinsing instead of pure water that is generally used for the rinsing.

Figure 4:
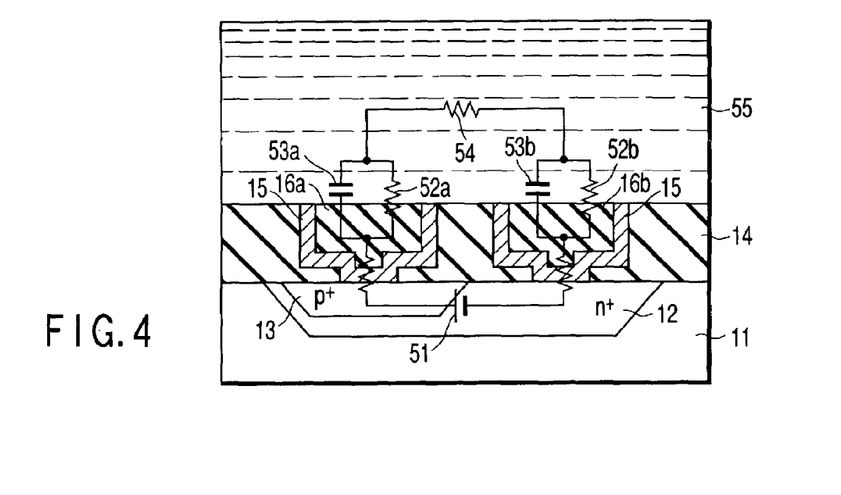
FIG. 4 is a schematic view showing the semiconductor device which is effective to prevent light corrosion occurrence and a current flowing in a solution according to the first embodiment.

The reason why the anode water 38 is effective to prevent the light corrosion will be described with reference to FIG. 4. FIG. 4 is a schematic view showing the semiconductor device and a current flowing in a solution.

As shown in FIG. 4, a p-n junction portion has an electromotive force 51 due to a potential difference of 0.7 V or less. The wirings 16a and 16b are exposed on the device surface. The wirings 16a and 16b are in contact with a solution 55.

At this time, this electrochemical circuit can be modeled as follows. Polarization resistances 52 (52a, 52b) each of which represents, using a resistance, the difficulty of reaction that occurs between the solution and a corresponding wiring are respectively present on the surfaces of the wirings 16a and 16b. In addition, electric double layer capacitances 53 (53a and 53b) are present because the solution forms an electric double layer near each wiring. Further, a resistive component 54 of the solution itself is present.

In this electrochemically-modeled circuit, to decrease a current flowing in the circuit, the electromotive force 51 at the p-n junction portion can be eliminated. To eliminate the electromotive force, the entire device can be shielded against light, but it is difficult to do so in most cases because of the machine structure. Even when the device is not shielded against light, if the resistive component 54 or each polarization resistance 52 increases, the value of a current flowing in the circuit can be suppressed.

To increase the resistive component 54, electrolytes in the solution need to be decreased. Since reaction progresses by using the electrolytes in the etching solution or the slurry used in CMP, it is difficult to remove the electrolytes. If the solution on the device surface is rapidly replaced by a solution containing no electrolytes after etching or CMP, no unwanted current flows in the circuit after the process. Consequently, the occurrence of light corrosion can be suppressed.

Generally, a solution containing no electrolytes is deionized pure water or ultra pure water. Nonetheless, anode water and oxidizing gas-dissolved water can suppress the current more effectively than ultra pure water. Note that anode water and oxidizing gas-dissolved water contains far more gas than ultra pure water. A large amount of gas is dissolved in the anode water and oxidizing gas-dissolved water, which is larger than that dissolved in the ultra pure water. This oxidizes the surface of Cu to increase the capacitance of each electric double layer capacitance 53. As a result, a current is difficult to flow. When water containing OH radicals is used, the surface of Cu is easily oxidized as compared with a case wherein ultra pure water or gas dissolved water is used, and a current is difficult to flow. Similarly, when anode water is supplied through a megasonic nozzle, OH radicals can be effectively produced. Therefore, it is effective to combine the megasonic cleaning with anode water in step S106 if that is possible on the device structure.

As a characteristic feature of the anode water, it can be rapidly replaced with contamination such as a sulfur compound attached on the device surface as compared with pure water. For example, a sulfur compound is used as a CMP slurry component sometimes and contained in a chemical solution for general acidizing and in a resist component, so that the sulfur compound is contained in a residue generated after forming via holes. In addition, a sulfur compound of several 10 to several 100 ppb is generally contained in an atmosphere. When a sulfur compound is attached on the surface of Cu, a battery is locally formed. Consequently, corrosion occurs. That is, when contaminants such as a sulfur compound and the like are attached on the upper surface of Cu, a potential at the contaminated portion becomes higher than that in the periphery, so that corrosion may be easily induced. Likewise, for light corrosion, since the contaminated portion increases a potential difference, light corrosion easily progresses from that portion. Sometimes these contaminants are not sufficiently removed in the slurry and polishing dust processing in step S103. However, the residual contaminants can be rapidly removed if anode water is used, thereby preventing such corrosion.

Anode water is used in the aforementioned description. The anode water may be replaced by an oxidizing gas-dissolved water prepared by dissolving oxidizing gas, such as oxygen, ozone, carbon monoxide or hydrogen peroxide, in pure water or ultra pure water. Alternatively, the anode water may be replaced by a radical-containing solution obtained by introducing radical molecules and/or atoms, such as O radicals or OH radicals, into pure water or ultra pure water. Either the oxidizing gas-dissolved water or the radical-containing solution can be expected to attain the same advantage as the anode water.

Abrasive particles are effectively removed from the polished surface of the device when the surface is washed with cathode water obtained by electrolyzing pure water or ultra pure water or with a solution (reducing gas-dissolved water) prepared by dissolving reducing gas in pure water or ultra pure water. The abrasive particles coated with electrolytes are removed from the device when the cathode water or the oxidizing gas-dissolved water is applied to the device after the CMP is performed. As a result, the resistance of the solution remaining on the device rises to suppress corrosion. The reducing gas dissolved in the solution may be hydrogen, $H_2S$, $NHO_2$, $H_2SO_3$ or the like. The "cathode water" is obtained at the cathode when water is electrolyzed.

If the oxidizing gas-dissolved water, a radical-containing solution, cathode water, or a reducing gas-dissolved water is applied to the surface of the device, at which copper wirings are exposed, for the same reason the anode water is applied to the surface of the device, it is desired that ultra pure water be used to prepare them. It is desired that the pure water or ultra pure water used in preparing the anode water, cathode water, the oxidizing gas-dissolved water and the reducing gas-dissolved water should contain no electrolytes.

At Step 104 and Step 106, two liquids may be simultaneously applied to the surface of the device at the same time. The first liquid is one member or a combination of at least two members, either selected from the group consisting of the anode water, the oxidizing gas-dissolved water and the radical-containing solution. The second liquid is one selected from the group consisting of the cathode water and the reducing gas-dissolved water or a combination of the two members of this group. In this case, the wirings are oxidized at surface and the abrasive particles are effectively removed from the device. This helps to suppress corrosion more efficiently.

The first liquid and the second liquid may be mixed at an appropriate ratio, and the resultant mixture liquid may be applied to the surface of the device. If this is the case, the difference between the wirings and the barrier metal in terms of surface potential will decrease to prevent corrosion. Assume that the wirings are made of Cu and that the barrier metal is made of Ta. Then, more cathode water is used than anode water. As a result, the oxygen concentration decreases to 10 ppm or less and the hydrogen concentration increases to 0.5 ppm or more. Hence, the potential difference between Cu and Ta is reduced.

(Second Embodiment)

The first embodiment has demonstrated that, to suppress the occurrence of light corrosion, it is effective to increase the polarization resistances 52 in the equivalent circuit shown in FIG. 4. The polarization resistances 52 can also be increased by passivating an wiring surface. More specifically, an organic substance is adsorbed in the wiring surface. Alternatively, the wiring surface is oxidized. In this embodiment, a method of preventing light corrosion by adsorbing an organic substance in an wiring surface will be described.

Figure 5:
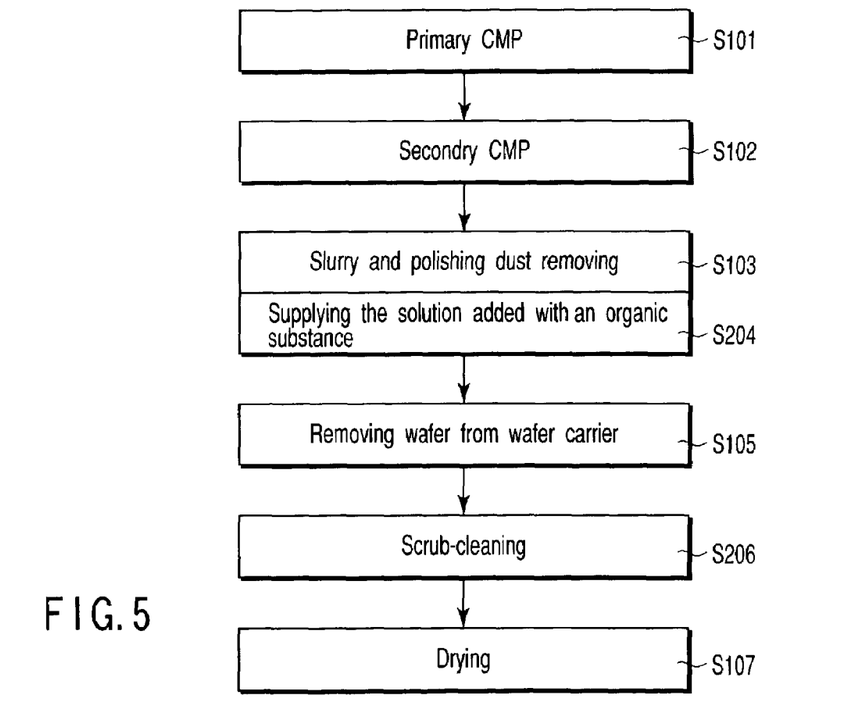
FIG. 5 is a flow chart for explaining the manufacturing process of a semiconductor device according to the second embodiment.
Figure 6A:
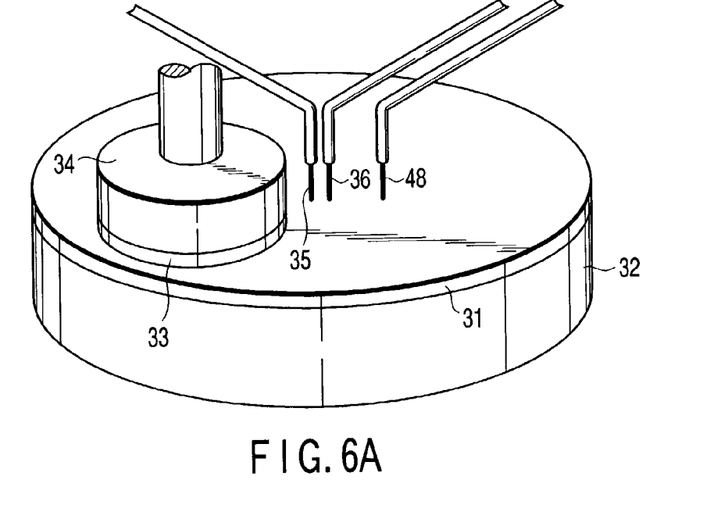
FIGS. 6A to 6C are schematic views each showing a part of the manufacturing process of the semiconductor device according to the second embodiment.
Figure 6B:
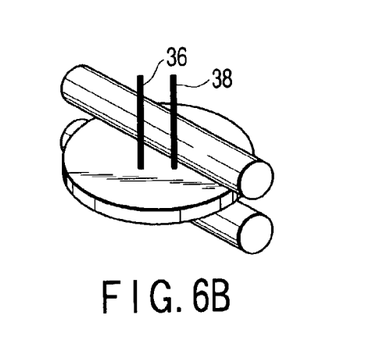
Figure 6C:
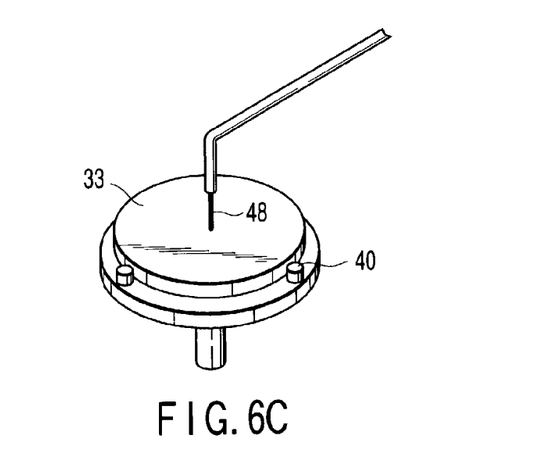

The manufacturing process of a semiconductor device according to the second embodiment will be described with reference to FIGS. 5 and 6A to 6C. FIG. 5 is a flow chart for explaining the manufacturing process of the semiconductor device according to the second embodiment of the present invention. FIGS. 6A to 6C are schematic views each showing a part of the manufacturing process of the semiconductor device according to the second embodiment of the present invention. Note that in FIG. 5, the same reference numerals as in the flow chart shown in FIG. 2 denote the same processes, and a description thereof will be omitted. In FIGS. 6A to 6C, the same reference numerals as in FIGS. 3A to 3C denote the same parts, and a description thereof will be omitted.

(Step S204: Cleaning)

After the secondary CMP (step S102) is completed, as shown in FIG. 6A, an organic substance-adding solution 48 is supplied onto a polishing pad 31. The organic substance-adding solution 48 is a solution which is prepared by organic substance such as BTA (benzotriazole) is added to pure water. The timing of supplying the organic substance-adding solution 48 is different from an object to be cleaned or the kind of slurry. For example, after a chemical solution 36 is supplied to remove foreign substances such as a slurry and polishing dust that are left on the wirings of a device, the organic substance-adding solution 48 is supplied as soon as possible. Alternatively, the organic substance-adding solution 48 and the chemical solution 36 are simultaneously supplied. In either case, the organic substance is adsorbed in Cu and a barrier metal to prevent charge exchange on a device surface, thereby preventing light corrosion.

Likewise, as shown in FIG. 6B, the organic substance-adding solution 48 and chemical solution 36 are simultaneously supplied in scrub-cleaning (step S206) similar to the scrub-cleaning (step S106) in the first embodiment.

Before drying (step S107), the organic substance-adding solution 48 may be supplied as needed, as shown in FIG. 6C. Since, however, pure water rinsing hardly removes the adsorbed organic substance, the need for supplying the organic substance-adding solution again is a little. Since the organic substance is attached to the surface of copper, the organic substance-adding solution 48 is not needed and only pure water rinsing is needed.

As an organic solution other than BTA, an organic substance-adding solution, such as benzimidazole (BI), N—N ammonium sodium diethyldithiocarbamate, cupferron, or picolinic acid may be used.

For the same reason as in the first embodiment, it is desirable to use ultra pure water in preparing an organic substance-adding solution and which is to be applied to the surface of a device, at which copper wirings are exposed. It is desired that pure water and ultra pure water used to prepare such an organic substance-adding solution should contain no electrolytes.

(Third Embodiment)

Figure 7A:
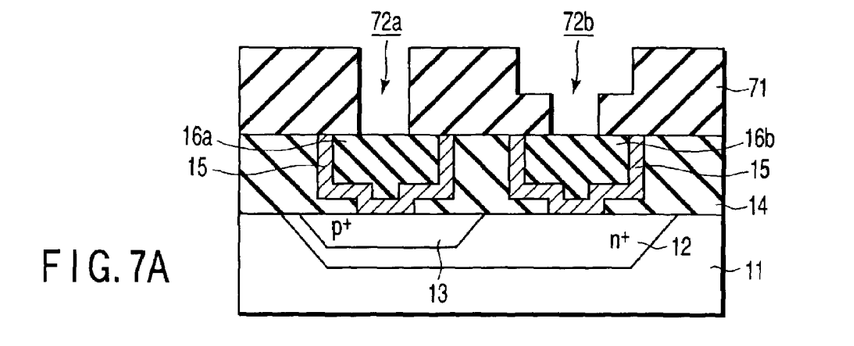
FIGS. 7A to 7C are process sectional views showing the manufacturing process of a semiconductor device according to the third embodiment.
Figure 7B:
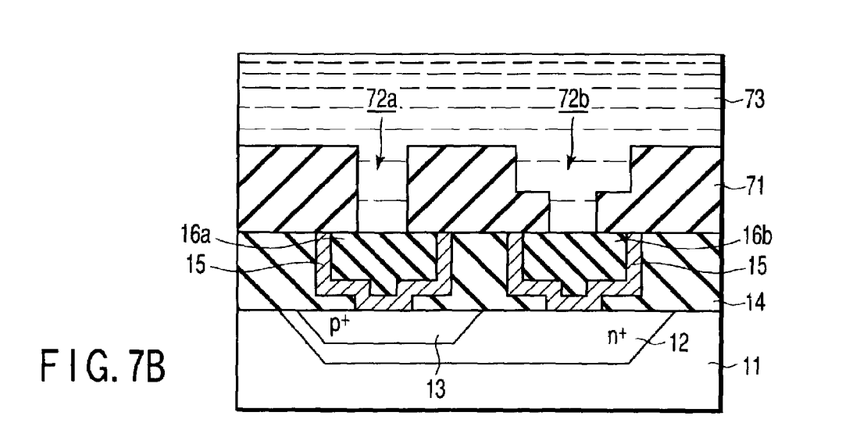
Figure 7C:
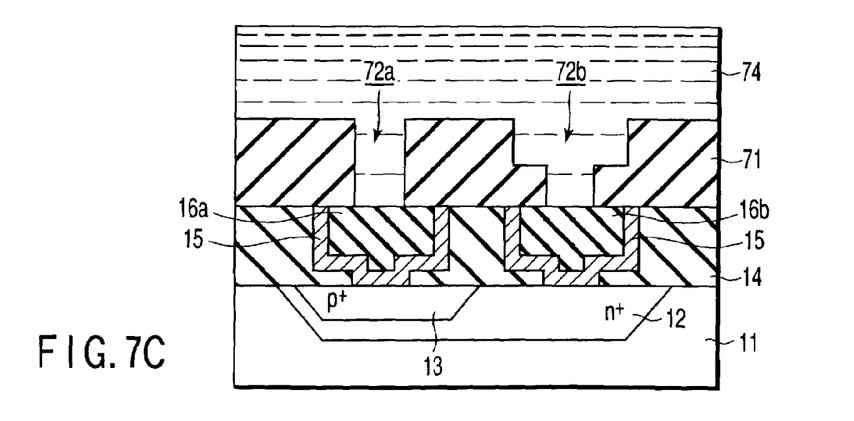

FIGS. 7A to 7C are process sectional views showing the manufacturing process of a semiconductor device according to the third embodiment of the present invention. In FIGS. 7A to 7C, the same reference numerals as in FIGS. 1A and 1B denote the same parts, and a description thereof will be omitted.

As shown in FIG. 7A, an interlayer dielectric film 71 is formed on wirings 16a and 16b and an insulating film 14. Resist patterns (not shown) are formed on the interlayer dielectric film 71. The interlayer dielectric film 71 is etched by using the resist patterns as masks by RIE, which uses an etching gas, to form via holes 72a and 72b having bottom surfaces on which the wirings 16a and 16b are respectively exposed. The resist patterns are then removed.

As shown in FIG. 7B, a chemical solution 73 is supplied to a device surface to perform a chemical solution treatment. After forming the via holes 72a and 72b in the interlayer dielectric film 71, a resist residue or/and a reactive product produced by reacting a gas with components of the wiring or the insulating film is attached in the via holes in most cases.

To remove the resist residue or/and the reaction product, a chemical solution treatment is generally performed as a post-process after forming the via holes 72a and 72b.

In this chemical solution treatment, the chemical solution 73 contacts the surface of the wiring in each of the via holes 72a and 72b. In most cases, the chemical solution 73 is an acid and alkaline solution including electrolytes. When light strikes the device surface in this state, holes and electrons are produced at a p-n junction portion, thereby causing dissolution and ion segregation in the wiring. Therefore, a chemical solution treatment chamber is preferably a darkroom.

As shown in FIG. 7C, cleaning as described in the first embodiment which uses anode water 74 is then performed. In this cleaning, anode water 74 is replaced with the chemical solution 73 in each of the via holes 72a and 72b. This prevents dissolution/ion segregation reaction of the wirings 16a and 16b.

Ideally, cleaning may be performed in the darkroom, but it is difficult in most cases. Since a load/unload chamber in which a wafer is loaded/unloaded has a transparent window which allows to see from the outside, it is difficult to make all the inner portions of a cleaning unit dark. The cleaning chamber is generally different from the chemical solution treatment chamber and is close to the load/unload chamber, so light leaks from the load/unload chamber to the cleaning chamber. Therefore, cleaning using anode water is preferably performed instead of pure water cleaning.

In the chemical solution treatment, any kinds of chemical solutions have a dissolution/ion segregation reaction suppression effect because the surface potential of the wiring changes by mixing anode water with a chemical solution. Anode water may be used as a solution diluting the chemical solution 73.

Anode water is used in the case described above. Nonetheless, anode water may be replaced by oxidizing gas-dissolved water prepared by dissolving an oxidizing gas, such as oxygen, ozone, carbon monoxide or hydrogen peroxide, in pure water or ultra pure water. Alternatively, the anode water may be replaced by radical-containing solution by introducing radical molecules and/or atoms, such as O radicals or OH radicals, into pure water or ultra pure water. In either case, the same advantage can be attained as in the above case.

After the device is treated with the chemical solution, the device may be washed with either cathode water or reducing gas-dissolved water prepared by dissolving reducing gas in pure water or ultra pure water. The electrolyte-containing chemical solution sticks to the resist residue and the reaction product, both remaining on the surface of the device. When applied to the surface of the device, cathode water or reducing gas-dissolved water effectively removes the resist residue and the reaction product from the device. As a result, the resistance of the solution on the surface of the device increases, which suppresses corrosion.

A first liquid selected from the group consisting of the anode water, the oxidizing gas-dissolved water and the radical-containing solution, and a second liquid selected from the group consisting of the cathode water and the reducing gas-dissolved water may be simultaneously applied to the surface of the device. In this case, the wires are oxidized at surface and the residue resist and the reaction product are effectively removed. This suppresses corrosion.

As in the first embodiment, the first and second liquids may be mixed at an appropriate ratio, and the resultant mixture liquid may be applied to the surface of the device.

In this case, the difference between the wires and the barrier metal in terms of surface potential will decrease to prevent corrosion.

Moreover, the anode water may be replaced by a solution obtained by adding to pure water at least one substance selected from the group consisting of benzotriazole, binziimdazole, N—N ammonium sodium diethyldithiocarbamate, cupferron and picolinic acid.

Note that the prevent invention is not limited to the embodiments described above. For example, in each of the embodiments described above, copper is used as a conductor, but a metal or alloy including at least one of silicon, aluminum, tungsten, gold, and silver can be used as a conductor. Each of the embodiments described above represents an example of preventing light corrosion in damascene wirings in the first layer which are directly connected to the p-type and n-type semiconductor devices. However, the present invention may be applied to damascene wirings in an upper layer of the first layer. The present invention can be practiced in various modifications without departing from the spirit and scope thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:

preparing a base comprising a semiconductor substrate having a device surface side, a p-type semiconductor layer formed on the device surface side of the semiconductor substrate, a n-type semiconductor layer which is formed on the device surface side of the semiconductor substrate and forms a p-n junction together with the p-type semiconductor layer, an insulating film which is formed above the semiconductor substrate, p-type semiconductor layer, and n-type semiconductor layer and has a plurality of openings, and a conductor formed in the openings and on the insulating film and electrically connected to the p-type semiconductor layer and n-type semiconductor layer;

removing the conductor on the insulating film by performing chemical mechanical polishing by relatively moving the base and a polishing pad while supplying a slurry between the polishing pad and the base, in a state in which a surface of the polishing pad is contacted with the conductor which is placed face down, to form wirings in each of the plurality of openings;

applying, to suppress light corrosion, a liquid between the polishing pad and the base, without releasing the base from the polishing pad after forming the wirings, the liquid is at least one selected from the group consisting of a first solution prepared by dissolving oxidizing gas in pure water or ultra pure water, a second solution prepared by introducing radical atoms and/or molecules into pure water or ultra pure water, and a third solution prepared by dissolving reducing gas in pure water or ultra pure water; and releasing the base from the polishing pad.

2. A method according to claim 1, wherein the first solution is prepared by dissolving in pure water or ultra pure water at least one member selected from the group consisting of oxygen, ozone, carbon monoxide and hydrogen peroxide, and the third solution is prepared by dissolving in pure water or ultra pure water at least one member selected from the group consisting of hydrogen, $H_2S$, $HNO_3$, and $H_2SO_3$.

3. A method according to claim 1, further comprising:
making a device surface in which the wirings are exposed face up or sideways after releasing the base from the polishing pad; and
applying a liquid to the device surface placed face up or sideways, the liquid being at least one selected from the group consisting of the anode water, the first solution, the second solution, the cathode water and the third solution.

4. A method according to claim 3, wherein the first solution is prepared by dissolving in pure water or ultra pure water at least one member selected from the group consisting of oxygen, ozone, carbon monoxide and hydrogen peroxide, and the third solution is prepared by dissolving in pure water or ultra pure water at least one member selected from the group consisting of hydrogen, $H_2S$, $HNO_3$, and $H_2SO_3$.

5. A method according to claim 1, wherein:
the conductor includes Cu, and
the liquid is obtained or prepared using the ultra pure water.

6. A method according to claim 1, wherein a first liquid and a second liquid are applied between the polishing pad and the base, the first liquid being at least one selected from the group consisting of the first solution and the second solution, and the second liquid being the third solution.

7. A method according to claim 6, further wherein the first liquid and the second liquid are mixed.

8. A method of manufacturing a semiconductor device, comprising:
preparing a base comprising a semiconductor substrate having a device surface side, a p-type semiconductor layer formed on the device surface side of the semiconductor substrate, a n-type semiconductor layer which is formed on the device surface side of the semiconductor substrate and forms a p-n junction together with the p-type semiconductor layer, a first insulating film which is formed above the semiconductor substrate, p-type semiconductor layer and n-type semiconductor layer and has a plurality of first openings, a plurality of conductors formed in the first openings and electrically connected to each other via the p-n junction, and a second insulating film formed on the first insulating film and the conductors;
forming a plurality of second openings in the second insulating film, the conductors being exposed in a bottom surface of the second openings respectively;
applying a chemical solution containing electrolytes to a device surface of the base in which the second openings are formed; and
applying, to suppress light corrosion, a liquid to the device surface of the base during or after the applying the chemical solution, or both during and after the applying the chemical solution, the liquid being at least one selected from the group consisting of a first solution prepared by dissolving oxidizing gas in pure water or the ultra pure water, a second solution prepared by introducing radical atoms and/or molecules into pure water or ultra pure water, and a third solution prepared by dissolving reducing gas in pure water or ultra pure water.

9. A method according to claim 8, wherein at least one of resist residue and reaction product generated when the second openings are formed, is removed by the use of the chemical solution.

10. A method according to claim 8, wherein
the conductors include Cu, and
the liquid is obtained or prepared using the ultra pure water.

11. A method according to claim 8, wherein a first liquid and a second liquid are applied to the device surface of the base, the first liquid being at least one selected from the group consisting of the first solution and the second solution, and the second liquid being the third solution.

12. A method according to claim 8, wherein the first solution is prepared by dissolving in pure water or the ultra pure water at least one member selected from the group consisting of oxygen, ozone, carbon monoxide and hydrogen peroxide, and the third solution is prepared by dissolving in pure water or the ultra pure water at least one member selected from the group consisting of hydrogen, $H_2S$, $HNO_2$, and $H_2SO_3$.

13. A method according to claim 11, further wherein the first liquid and the second liquid are mixed.

14. A method of manufacturing a semiconductor device comprising:
preparing a base comprising a semiconductor substrate having a device surface side, a p-type semiconductor layer formed on the device surface side of the semiconductor substrate, a n-type semiconductor layer which is formed on the device surface side of the semiconductor substrate and forms a p-n junction together with the p-type semiconductor layer, an insulating film which is formed above the semiconductor substrate, p-type semiconductor layer, and n-type semiconductor layer and has a plurality of openings, and a conductor formed in the openings and on the insulating film and electrically connected to the p-type semiconductor layer and n-type semiconductor layer;
removing the conductor on the insulating film by performing chemical mechanical polishing by relatively moving the base and a polishing pad while supplying a slurry between the polishing pad and the base, in a state in which a surface of the polishing pad is contacted with the conductor which is placed face down, to form wirings in each of the plurality of openings;
applying, to suppress light corrosion, a liquid between the polishing pad and the base, without releasing the base from the polishing pad after forming the wirings, the liquid is at least one selected from the group consisting of anode water obtained by electrolyzing pure water or ultra pure water, a first solution prepared by dissolving oxidizing gas in pure water or ultra pure water, a second solution prepared by introducing radical atoms and/or molecules into pure water or ultra pure water, cathode water obtained by electrolyzing pure water or ultra pure water and a third solution prepared by dissolving reducing gas in pure water or ultra pure water; and
releasing the base from the polishing pad;
wherein a first liquid and a second liquid are applied between the polishing pad and the base, the first liquid being at least one selected from the group consisting of the anode water, the first solution and the second solution, and the second liquid being at least one selected from the group consisting of the cathode water and the third solution; and
wherein the first liquid and second liquid are mixed.

* * * * *

UNITED STATES PATENT AND TRADEMARK OFFICE
CERTIFICATE OF CORRECTION

PATENT NO. : 6,992,009 B2
DATED : January 31, 2006
INVENTOR(S) : Kodera et al.

It is certified that error appears in the above-identified patent and that said Letters Patent is hereby corrected as shown below:

Column 11,
Lines 3 and 20, change "$HNO_3$," to -- $HNO_2$, --.

Signed and Sealed this

Twenty-fifth Day of April, 2006

JON W. DUDAS
*Director of the United States Patent and Trademark Office*